US011527858B2

United States Patent
Seow

(10) Patent No.: US 11,527,858 B2
(45) Date of Patent: Dec. 13, 2022

(54) ELECTRICAL OUTLET MOUNTS AND ILLUMINATION FOR CONDUCTIVE PANEL ASSEMBLIES

(71) Applicant: EXXEL TECHNOLOGY PTE LTD, Singapore (SG)

(72) Inventor: Thiam Hin Kennie Seow, Singapore (SG)

(73) Assignee: EXXEL TECHNOLOGY PTE LTD, Singapore (SG)

( * ) Notice: Subject to any disclaimer, the term of this patent is extended or adjusted under 35 U.S.C. 154(b) by 3 days.

(21) Appl. No.: 17/055,464

(22) PCT Filed: May 3, 2019

(86) PCT No.: PCT/SG2019/050251
§ 371 (c)(1),
(2) Date: Nov. 13, 2020

(87) PCT Pub. No.: WO2019/221669
PCT Pub. Date: Nov. 21, 2019

(65) Prior Publication Data
US 2021/0203115 A1 Jul. 1, 2021

(30) Foreign Application Priority Data
May 14, 2018 (SG) .............................. 10201804074S

(51) Int. Cl.
*H01R 12/52* (2011.01)
*H01R 33/22* (2006.01)
(Continued)

(52) U.S. Cl.
CPC ........... *H01R 33/225* (2013.01); *F21V 17/06* (2013.01); *F21V 23/06* (2013.01); *F21V 31/005* (2013.01);
(Continued)

(58) Field of Classification Search
CPC ........ F21V 17/06; F21V 23/06; F21V 31/005; H01R 33/225; H01R 12/52;
(Continued)

(56) References Cited

U.S. PATENT DOCUMENTS

| 2,043,499 A | 6/1936 | Vendope |
| 2,838,865 A | 6/1958 | Hardesty |

(Continued)

FOREIGN PATENT DOCUMENTS

| CN | 205487209 U | 8/2016 |
| DE | 4238928 C1 * | 4/1994 ............ F21V 19/001 |

(Continued)

OTHER PUBLICATIONS

Author unknown, Invisible wire, Internet, https://www.hogarthlighting.co.uk/technical/invisible_wire, 2018, 1 page.
(Continued)

*Primary Examiner* — Tho D Ta
(74) *Attorney, Agent, or Firm* — Aslan Law, P.C.

(57) ABSTRACT

An electrical outlet mount for externally mounting on a pair of conductive panes or conductive material on a pair of non-conductive panes. The mount is used for powering electrical/electronic elements and can be installed quickly and easily, and which offers an attractive finish with unobstructed view. The electrical outlet mount has a back end and a front end, a first electrical contact element located at the back end arranged for electrical contact with a first conductive panel and a second electrical contact element located towards the front end, in spaced arrangement from the first electrical contact element for electrical contact with a second conductive panel. The electrical outlet mount may extend out through an opening in one of the panels to receive electrical/electronic elements disposed externally to such space.

20 Claims, 7 Drawing Sheets

(51) Int. Cl.
*F21V 17/06* (2006.01)
*F21V 23/06* (2006.01)
*F21V 31/00* (2006.01)
*H01R 13/52* (2006.01)
*H01R 13/74* (2006.01)
*H01R 31/06* (2006.01)
*H01R 33/18* (2006.01)
*H01R 33/46* (2006.01)
*H01R 33/965* (2006.01)
*H01L 25/16* (2006.01)

(52) U.S. Cl.
CPC ......... *H01R 12/52* (2013.01); *H01R 13/5213* (2013.01); *H01R 13/74* (2013.01); *H01R 13/748* (2013.01); *H01R 31/06* (2013.01); *H01R 33/18* (2013.01); *H01R 33/465* (2013.01); *H01R 33/9651* (2013.01); *H01R 33/9655* (2013.01); *H01L 25/162* (2013.01); *H01L 25/167* (2013.01)

(58) Field of Classification Search
CPC .. H01R 13/5213; H01R 13/74; H01R 13/748; H01R 31/06; H01R 33/18; H01R 33/465; H01R 33/9651; H01R 33/9655
See application file for complete search history.

(56) References Cited

U.S. PATENT DOCUMENTS

| | | | | |
|---|---|---|---|---|
| 6,079,986 | A * | 6/2000 | Beshears | H01R 12/52 439/63 |
| 6,609,914 | B2 * | 8/2003 | Dibene, II | H01R 12/7088 439/74 |
| 2011/0063838 | A1 | 3/2011 | Dau et al. | |
| 2016/0033098 | A1 | 2/2016 | Bergman et al. | |

FOREIGN PATENT DOCUMENTS

| | | |
|---|---|---|
| SG | 185152 A1 | 11/2012 |
| TW | I491080 B | 7/2015 |

OTHER PUBLICATIONS

Author unknown, Kontakt-Bord, Internet, https://www.nl-elektro.de/produkte/kontakt-bord.html, 2018, 7 pages.
Author unknown, Eubiq GSS Product Sheet, Internet, http://www.poly-m.asia/resources/ck/files/Product%20Sheets/Eubiq%20GSS.pdf, 2018, 4 pages.

* cited by examiner

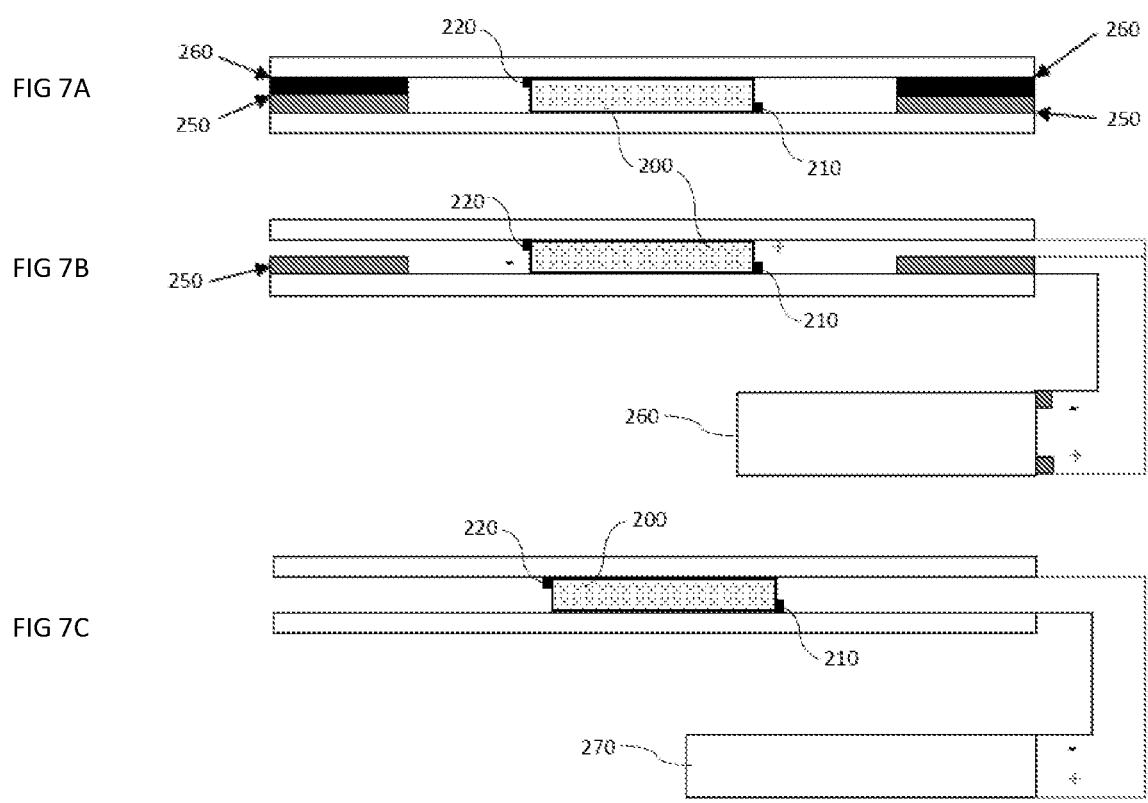

ELECTRICAL OUTLET MOUNTS AND ILLUMINATION FOR CONDUCTIVE PANEL ASSEMBLIES

CROSS-REFERENCE TO RELATED APPLICATIONS

This application is a National Stage Entry of PCT/SG2019/050251 filed on May 3, 2019. This application claims priority to SG Patent Application No. 10201804074S filed on May 14, 2018, and to PCT Application No. PCT/SG2019/050251 filed on May 3, 2019, the entire contents of which are hereby incorporated by reference.

FIELD OF THE INVENTION

The present invention relates to an AC/DC electrical mount for externally or internally mounting on a pair of conductive panes or conductive material on a pair of non-conductive pane's surface for powering electrical/electronic elements. The invention facilitates quick, and easy installation and allows access to the power supply at any location along the panes while offering an attractive finish with unobstructed view that favours installation in both commercial and domestic environment.

BACKGROUND

The electrical system of any commercial or domestic space is a complex system of electrical wiring that terminates in light fittings, ceiling fans, switches or power points (wall outlets). Cable trucking is commonly used to hide and protect these wires but are generally considered an unsightly distraction to the aesthetics of the space. Various methods are commonly employed to hide electrical wiring and their conduits such as the use of a false ceiling to hide wiring to light fixtures, concealing trucking in cornices, carpentry, floor or within wall slots covered with plastering. Such installation requires additional maintenance and trap dirt easily.

An elegant method of installing wiring is the use of "invisible" wiring systems consisting of very thin copper tracks that are barely noticeable once painted over. Such wiring is offered by specialist lighting providers such as http://www.hogarthlighting.co.uk/technical/invisible wire.

On the other end of the spectrum, the presence of wires is embraced and the proprietor of the commercial or domestic space adopts an industrial look by emphasising the trunking pipes with colour or material and turning them around as a design feature within the space. Such installation is labour intensive and involves an element of design which drives up cost.

The layout of lighting and in general, the location of terminal electrical points based on all of the above described methods has to be considered at the initial stage of the interior design of any space since they are fixed once the wiring has been routed. Any repositioning of such points typically requires a professional electrician to rewire the electrical wiring.

Some flexibility in the positioning of light fixtures is provided by electrical track lighting system where light fixtures are attached anywhere on a continuous track device which contains electrical conductors. This is in contrast to directly routing electrical wiring to individual light positions. Tracks can either be mounted to ceilings or walls, lengthwise down beams, or crosswise across rafters or joists. They can also be hung with rods from especially high places like vaulted ceilings. However, the positioning of light fixtures on such tracks are ultimately limited by the dimensions and positioning of the track. Wiring that supplies power to the track system still requires to be hidden/protected by conventional methods as previously discussed.

Electrified tracks such as the Kontakt-Bord® by N&L ElektrotechnikGmbHand and the GSS System™ by Eubiq Pte Ltd also available in the market that allow users to add, remove and reposition power outlets and various electrical appliances directly. The grooves that receives the power outlets and electrical appliances trap dirt and insects and are hard and hazardous to clean. The positioning of the outlets and appliances are also limited by the dimensions and positioning of the tracks.

The present invention is based on the same principles of the inventor's earlier invention "LIGHT EMITTING DIODE PACKAGES AND THEIR USES" that has been granted in Singapore and Taiwan as patent number 2011027430 and patent number 1491080 respectively. It discloses a novel mount for drawing power from a pair of conductive panes or conductive material on a pair of non-conductive pane's surface. The mount can be used to power electrical/electronic elements on the exposed surface of the panes or within the panes. The panes are envisioned to be installed in various parts of a building such as a ceiling, partition, window or wall or as a standalone display without the need for wiring across the surface.

The invention is aesthetically pleasing with clean and unobstructed view for panes that are non-opaque since the panes are free of wires or trunking, easy to maintain, facilitates easy installation of electrical/electronic elements such as light fixtures across the entire surface where repositioning of such elements can easily be achieved by a layperson since no wiring and trunking is needed. Translucent patterns, images or pictures may further be applied to the exposed panel surface for decorative purposes.

SUMMARY OF THE INVENTION

In the present invention, novel electrical outlet mounts are disclosed for drawing power from a pair of spaced apart conductive panels or conductive material on a pair of non-conductive panels' surface secured by a frame or any other element of assembly. The space between the two panels electrically isolates them from one another, these two panels being active conductors and arranged to receive either Direct Current (DC) or Alternating Current (AC) from a power source, for example, for Singapore 230 volts at 50 Hz or DC of up to 120 V may be supplied to the conductive panels.

The electrical outlet mount has a back end and a front end, a first electrical contact element located at the back end arranged for electrical contact with a first conductive panel and a second electrical contact element located towards the front end, in spaced arrangement from the first electrical contact element for electrical contact with a second conductive panel.

The first and second conductive panels are spaced apart and arranged in a face-to-face relation. The two electrical contact elements of the outlet mount provide power lead-in to electrical/electronic elements and are arranged to define two substantially planar but spaced apart conducting planes, in mating relation with the pair of conducting panels or conductive material on a pair of non-conductive panels' surface.

The disclosed electrical mount is adapted to provide power lead in to electrical/electronic elements such as LED lights wholly disposed within the space between the panels as well as elements disposed externally to such space. In the case of the latter, an electrical receptacle is located in an opening located at the front end of the electrical mount.

Depending on the type of electrical/electronic element that is powered by the electrical mount, the electrical receptacle may be a threaded standard light socket such as E26/27, E12, SES/E14, a bayonet connector such as BC/B22, pin-type connector, a quick coupling light fixture connector or any types of customised socket.

For the electrical mount that powers elements disposed externally to the space between the panels, the electrical mount fits within an opening in the second conductive panel, such that the electrical receptacle is accessible from the exposed side of the second conductive panel. Typically, the electrical outlet mount is cylindrical in shape. However, rectilinear or outlet mounts of other shapes are possible. The pair of conductive panels may be installed as the ceiling of a room, a room partition, feature wall, furniture, for use in signage, advertising boards, or simply as windows.

For establishing good electrical contact with the first panel, the first electrical contact may be a leaf, arched shaped, domed shaped, coiled spring or any other spring-like shape. The second contact element may be an integral fin extending transversely from the main axis of the mount. The second electrical contact element may at the same time be adapted to retain the electrical mount in the opening of the second panel.

The electrical outlet mount may be mounted on the opening of the second conductive panel by interference fit, where the hole is cut to closely match the exterior dimension of the electrical mount.

Where the electrical outlet mount is cylindrical, a threaded female coupling ring (fastener) adapted to be connected to threads located on the external surface of the front end of the electrical mount may be provided. Engaging and further turning of the coupling ring (fastener) in the tightening direction on the electrical mount tightens the second contact element against the inner conductive surface of the second panel, leading to good electrical contact between the second contact element and the second panel.

Other forms of coupling mechanism may be contemplated, such as rachet and paw engagement commonly seen in cable ties between the coupling member and distal end of the electrical mount. Such coupling mechanism will be applicable to rectilinear or mounts of other shapes. When the coupling member is made of metal (non-metal material can be used as well), a protective insulator cap is provided. For a splash proof or even water proof installation, a gasket seal/O-ring may additionally be provided to seal the insulator cap. When the electrical receptacle is adapted to receive a light element, the insulator cap may be integrally formed with a light reflector. This light reflector can be further sealed with transparent cover for splash proof usage. This insulator cap and light reflector can be in any form or shaped for aesthetic purposes.

For electrical loads of higher amperage, sections of the panel assembly that make electrical contact with the electrical outlet mount can also be further enhanced with conductive materials, e.g. silver conductive frit.

In another embodiment, the present invention provides a panel assembly comprising two spaced apart, non-opaque panels arranged in a face-to-face relation, wherein each of the two inside surfaces of the panel assembly has an electrically conductive layer; and an electrical mount mounted within the space between the panels, in electrical contact with both spaced apart panels, so that a power supply, connectable to said electrically conductive layers, delivers electric power to power electrical/electronic elements such as LED lights wholly disposed within the space between the panels.

In yet another embodiment, the present invention provides a panel assembly comprising two spaced apart, non-opaque panels arranged in a face-to-face relation, wherein each of the two inside surfaces of the panel assembly has an electrically conductive layer; and an electrical outlet mount mounted on an opening of the second panel and in electrical contact with both spaced apart panels, so that a power supply, connectable to said electrically conductive layers, delivers electric power to power an electrical receptacle located at a front end of the electrical mount.

BRIEF DESCRIPTION OF THE DRAWINGS

This invention will be described by way of non-limiting embodiments of the present invention, with reference to the accompanying drawings, in which:

FIGS. 7A 7C illustrates various of ways of supplying power to the lighted firefighting access triangle of FIG. 6

DETAILED DESCRIPTION

Figure 1:
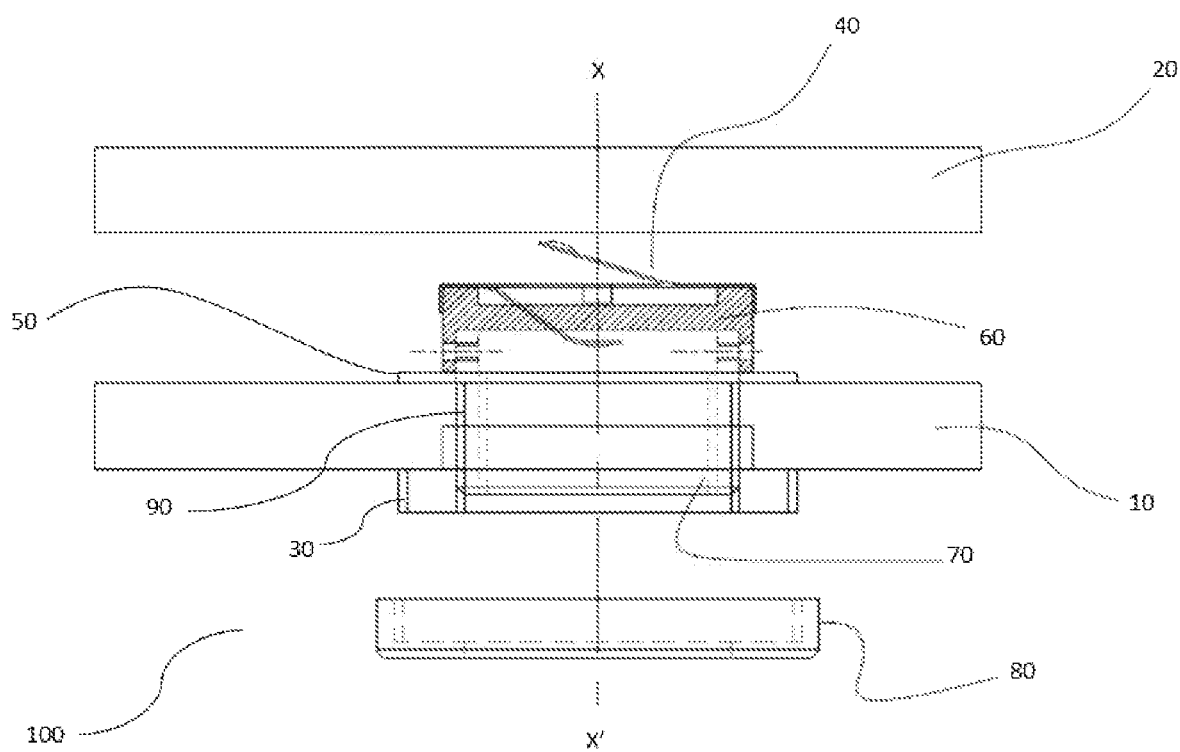
FIG. 1 is a partial exploded plan view of an electrical outlet mount according to an embodiment of the present invention.

One or more specific and alternative embodiments of the present invention will now be described with reference to the attached drawings. It shall be apparent to one skilled in the art, however, that this invention may be practised without such specific details. Some of the details may not be described at length so as not to obscure the invention. For ease of reference, common reference numerals or series of numerals will be used throughout the figures when referring to the same or similar features common to the figures.

FIG. 1 is a partial exploded plan view of an electrical outlet mount 100 mounted on a panel assembly comprising a pair of conductive panels 10 and 20. The panel assembly may be installed vertically in a room as a wall partition, wall feature or as a double glaze window pane. When installed horizontally, the panel assembly may function as the ceiling of a room. Panels 10 and 20 can be made of non-conductive material such as glass, polycarbonate, acrylic, plastic, wood with conductive material applied on the inner surface or with metallic strips bonded on the inner surface. The conductive material may additionally be conductive tape, glue or ink. Where the panels are made of non-opaque material such as glass, polycarbonate, acrylic, plastic, the conductive material is preferably transparent conductive oxide (TCO) coating such as indium tin oxide (ITO) so that light passing across the panels is not obscured.

The main body 90 of electrical outlet mount 100 is a cylindrical metal ring with threads located on the external surface of its front end and its interior walls. An annular conductive fin 50 located near the back end extends from the external surface of the main body 90, transversely to the metal ring's central axis X-X'. First electrical contact 40 is a metal cap designed to fit over the back end of main body 90, and electrically insulated from main body 90 by electrical insulator 60 sandwiched between the first electrical contact 40 and main body 90.

Electrical contact 40 is arranged for contact with the inner surface of panel 20. For reliable electrical contact with panel 20, one or more resilient members in the form of a leaf spring bias electrical contact 40 against the inner surface of panel 20. The space defined by the interior walls of the main body 90, electrical insulator 60 and electrical contact 40 forms electrical receptacle 70 which is adapted to receive a standard E27 bulb. Another resilient member of electrical contact 40 extends through a gap in the electrical insulator 60 into receptacle 70 for electrical contact with the bottom terminal contact of the E27 bulb.

Annular conductive fin 50 functions as the second electrical contact of the electrical outlet mount 100 for electrical contact with the inner surface of panel 10. As conductive fin 50 and main body 90 are integrally formed, electric charge can flow between the inner surface of panel 10 and the interior walls of main body 90.

When electrical mount 100 is mounted onto the panel assembly, main body 90 is inserted through an opening formed in panel 10 such that its front end extends out from the exposed side of panel 10 and conductive fin 50 abuts against the inner surface of panel 10. Electrical insulator 60 and first electrical contact 40 may be fitted onto the back end of main body 90 before or after insertion of main body 90 into the opening of panel 10. Screws indicated by dotted lines extending across aligned through holes in electrical insulator 60 and main body 90 may be used to releasably secure electrical insulator 60 to main body 90.

On the exposed side of panel 10, a fastener 30 with mating thread couples with the front end of main body 90. Engaging and further turning of fastener 30 in the tightening direction draws conductive fin 50 tightly against the inner surface of panel 10, ensuring good electrical contact between conductive fin 50 and the inner surface of panel 10. The inner surface of panel 10 that comes into contact with conductive fin 50 may be coated with silver conductive frit for enhanced conductivity when the intended electrical load is of high amperage. Fastener 30 may be coupled with main body 90 of electrical outlet mount 100 through other fastening means such as rachet and paw or snap fit. As fastener 30 is typically made of metal, a protective insulator cover 80 is provided to fit over fastener 30, shielding users from inadvertent contact. The insulation cover 80 can be in any design, form or shape for aesthetic purposes.

Figure 2:
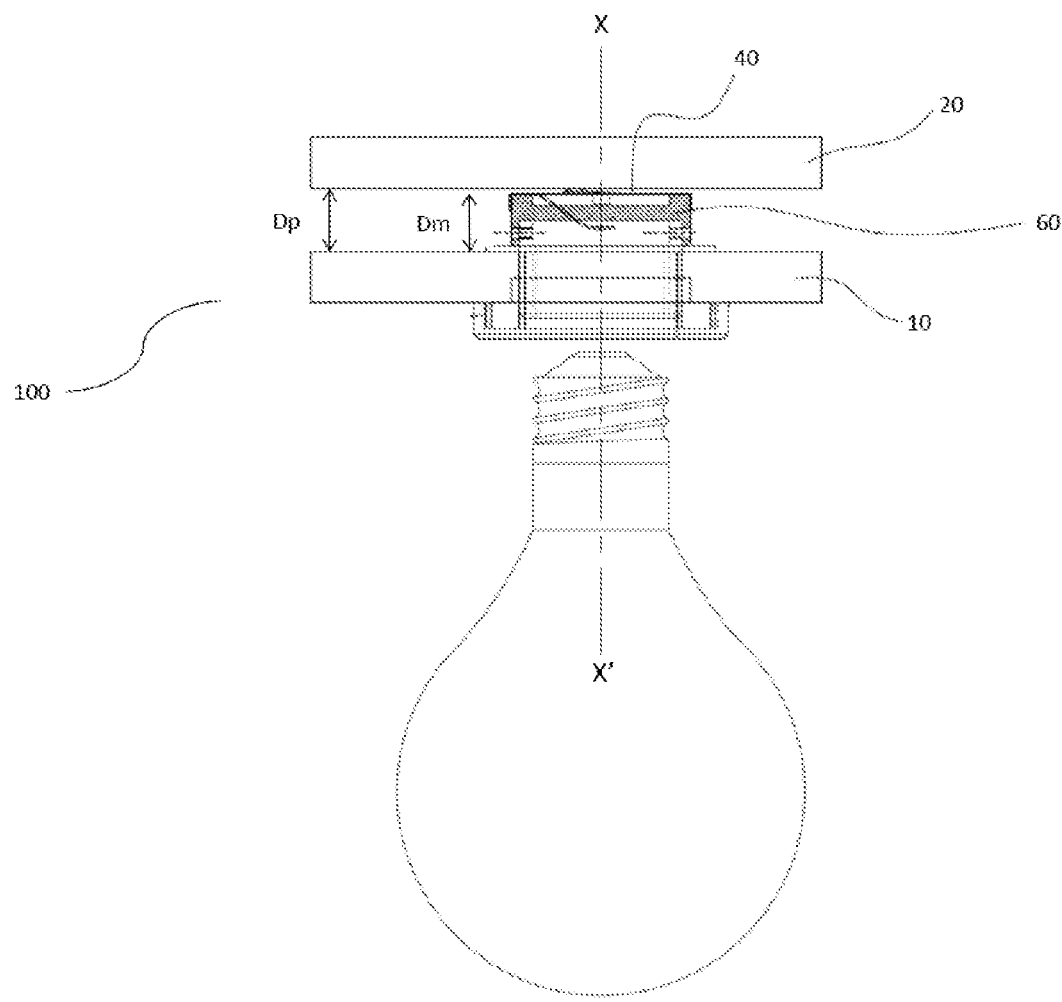
FIG. 2 is a plan view of the electrical outlet mount of FIG. 1 after panel 20 has been secured in position.

After electrical insulator 60 and electrical contact 40 has been fitted onto the main body, panel 20 is secured in position relative to panel 10. The dimensions of mount 100 is arranged such that a close fit is established between panel 20 and flat bottom end of mount 100 after panel 20 is secured in position as shown in FIG. 2. Specifically, after panel 20 is secured in position, the depth of the section of mount 100 that extends into the internal space of the panel assembly (Dm) is essentially the same as the distance between panel 10 and panel 20 (Dp). It is however not critical Dm and Dp are exactly the same, a slight difference is acceptable as long as electrical contact 40 can maintain good electrical contact with panel 20. A DC or AC current is passed across the panel assembly and powers the bulb that is inserted into the electrical receptacle 70. When the current is AC, preferably panel 20 is connected to live wire and panel 10 connected to the neutral wire.

Figure 3:
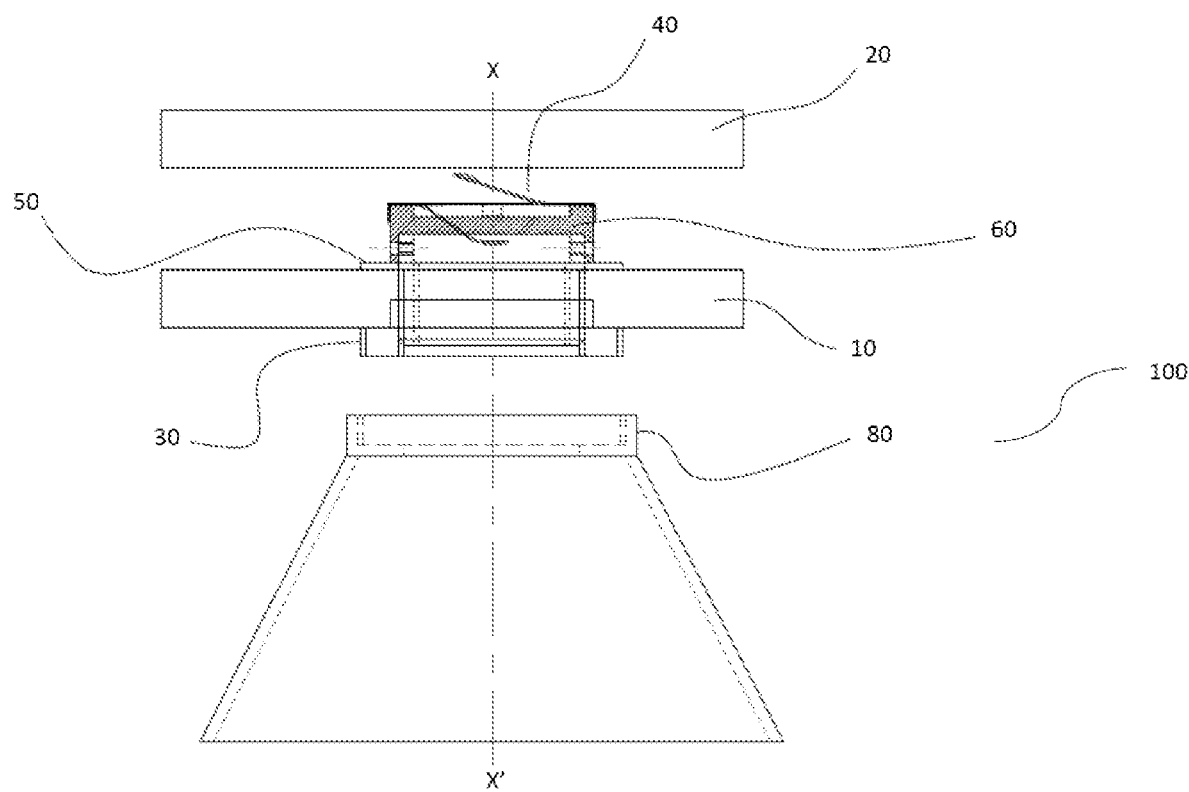
FIG. 3 is a plan view of the electrical outlet mount of FIG. 1 whereby a lamp reflector is integrally formed with the insulator cap.
Figure 4:
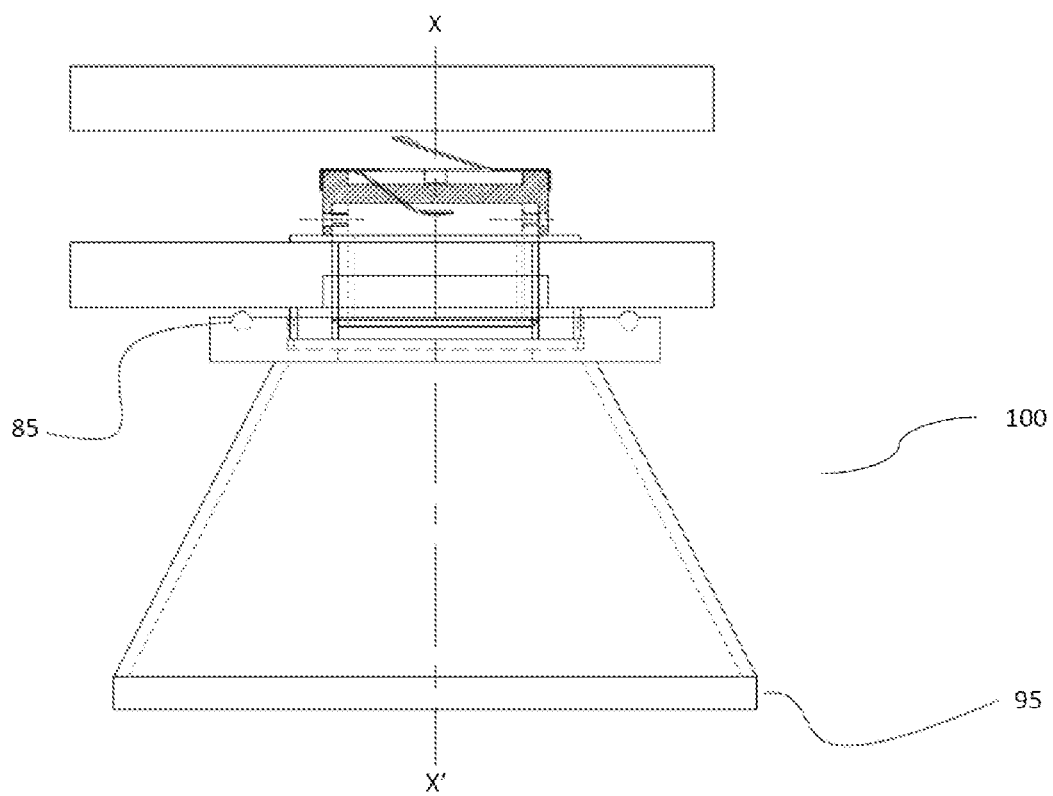
FIG. 4 shows a lamp reflector with gasket/O-ring and fully sealed transparent cover on the front end for splash proof usage.

Referring to FIGS. 3 and 4, the same mount 100 is shown with a lamp reflector integrally formed with protective insulator cover 80. As seen in FIG. 3, an O-ring 85 may be provided to insulator cover 80 to create a fluid-tight seal. The lamp reflector is also further sealed with a transparent cover 95 for splash-proof usage. Transparent cover 95 is not limited to any size or shape.

Figure 5:
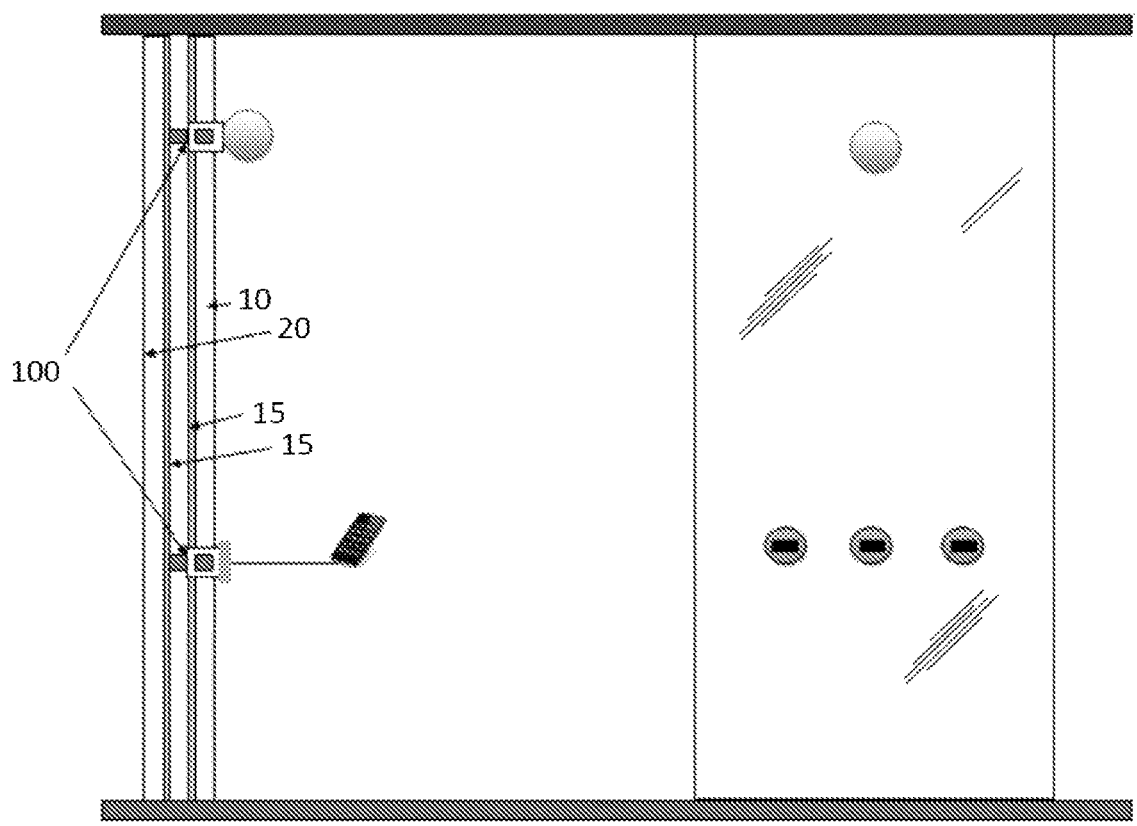
FIG. 5 illustrates the side and corresponding front view of a panel assembly with a number of electrical outlet mounts mounted on the assembly.

FIG. 5 provides the side and corresponding front view of a panel assembly installed with a number of electrical outlet mounts 100. The panel assembly is made of glass and the interior surface of the assembly 15 is coated with transparent conductive oxide (TCO) coating such as indium tin oxide (ITO). Electrical receptacle 70 of the first electrical outlet mount 100 powers a light bulb. With suitable adapters, the other three electrical outlet mounts 100 can have other usages or purposes, e.g. by using a USB power adapter (E27/USB), mounts 100 are adapted to receive and power USB devices power.

Alternatively, an adaptor with car charger socket (12V/24V) arranged with a E27 base can be used on the electrical mount 100. When the power input is AC, such adaptor includes an AC to DC power converter to convert the output to the corresponding socket voltage.

Due to the transparency of the panel assembly, mounts 100 appear floating in space with no apparent wires leading to the mounts. This interesting and attractive way of powering lights, USB devices and other electrical/electronic elements can have many applications in residential and commercial buildings and even art installations. The surface of a glass panel assembly may also be decorated for example by etching or paint for improved aesthetic appeal. When the panel assembly is installed as the ceiling and the mounts are used to power lights, the transparency of the panel makes the ceiling appear higher that it is, thus allowing rooms with low ceilings appear less claustrophobic.

The main advantage of the invention, however is that re-wiring is not necessary if mounts 100 are repositioned anywhere on the exposed side of the panel assembly. The panel assembly may also be made of other material such as wood with a thin layer of metal bonded on its interior surface, or other types of non-conductive material as determined by the design or purpose of panel.

Figure 6:
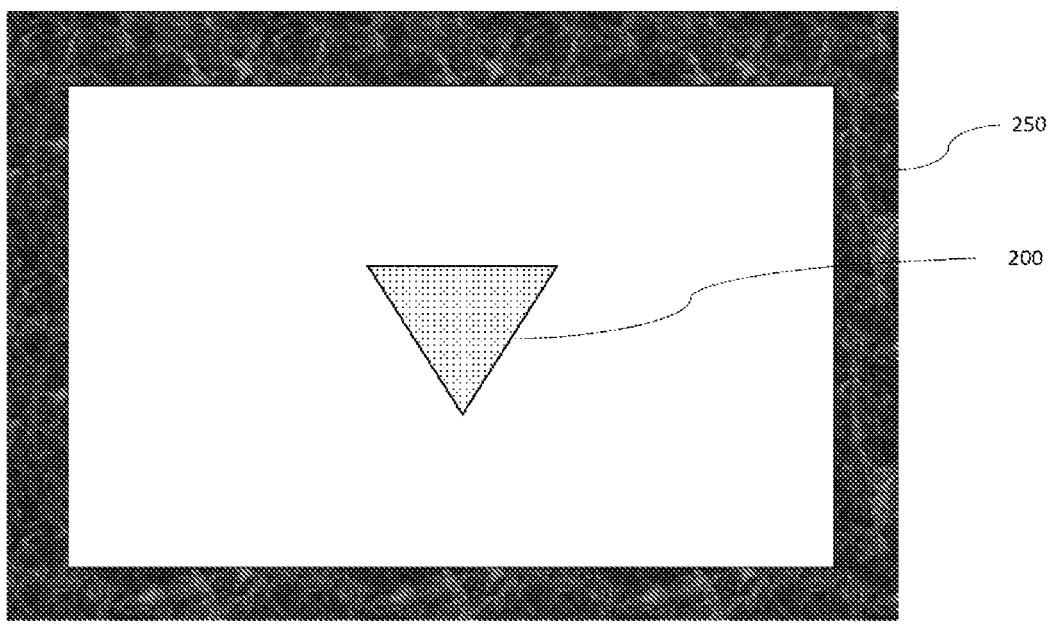
FIG. 6 illustrates a double-glazed window pane with lighted firefighting access triangle powered by a border of solar panels.

FIG. 6 shows a double-glazed window pane with lighted firefighting access signage 200 and a solar panel border. The firefighting access signage 200, solar panel 250 and rechargeable battery 260 are completely embedded within the space between the two layers of glass.

As seen in FIGS. 7A to 7C which is the side on view of an embedded lighted firefighting access signage 200, various means of powering the firefighting access signage 200 may be employed. The lower face of window pane of FIGS. 6A to 6C is the exterior facing side of the window pane. FIG. 7A is the side-on view of FIG. 6. Solar cells which may be mono/poly crystalline cells, thin film solar cells such as amorphous silicon, cadmium telluride forming solar panel 250 disposed within the window pane arranged around the border of the window pane to charge lithium-ion batteries 260 similarly disposed within the window pane. Transparent solar cells that absorb only infrared and ultraviolet light may be used for unobstructed view through the pane. Alternatively, as shown in FIG. 7B, the rechargeable battery is placed externally to the window pane, which is ideal when transparent solar cells are used. The rechargeable battery may also be charged by external power source to act as power backup in case of solar panel failure. As shown in FIG. 7C, the firefighting access signage 200 can also simply be powered by the mains using an AC/DC adaptor 270.

The fire access signage 200 comprises a number of connected light elements, preferably LEDs housed in a red or orange, translucent non-conductive housing. The colour and dimension of the signage is adapted to comply with local regulations such as Section 4.2.3(d) of "Chapter 4, SITE PLANNING EXTERNAL FIRE FIGHTING PROVISION" from the Singapore Civil Defence Force. Cathode terminals of the light emitting elements are linked to a common terminal, which is then electrically connected to a first contact element 210 lying essentially in same plane as the exterior facing side of the firefighting access signage 200. Similarly, anode terminals of the light emitting elements are linked to a common terminal which is then electrically connected to the second contact element 220 lying essentially in same plane as the interior facing side of the firefighting access signage 200.

First contact element 210 or both contact elements 210 and 220 may be formed with a leaf spring for reliable electrical contact with the inner conductive layers of the panel assembly. Such fire access signage 200 provides easy visual of the fire access windows both externally and internally during emergency. The self-powered embodiments of FIGS. 6A and 6B ensures that the signage is lit even during periods of interrupted mains supply.

While specific embodiments have been described and illustrated, it is understood that many changes, modifications, variations and combinations thereof could be made to the present invention without departing from the scope of the present invention. For example, a panel assembly similar to FIG. 7C where light elements are completed embedded within the space between two layers of glass may be used in ovens to provide illumination to the cooking area. For such instances, additional insulation will be provided to isolate the light elements from potential damage by the elevated temperatures generated by the oven.

The invention claimed is:

1. An electrical mount for installation in a panel assembly comprising a first panel and a second panel, the two panels are spaced apart and arranged in a face-to-face relation, where each of said panels has a respective inside surface, said inside surfaces are arranged in the face-to-face relation, each of said inside surfaces has a respective electrical conductive layer, the electrical mount comprising:
  a main body, wherein a back end of said main body is disposed in the space between the two panels and a front end of said main body extends out on an exposed surface of the second panel from an opening in said second panel;
  an electrical receptacle disposed in the front end of the main body for receiving an electrical/electronic element; and
  two contact elements supported by said main body for power lead-in to the electrical/electronic element when received by said electrical receptacle, wherein said two contact elements define two substantially planar but spaced apart contact planes.

2. The electrical mount according to claim 1, wherein a first contact element of the said two contact elements is disposed at the back end of said main body and a second contact element of the said two contact elements is spaced apart from and in a plane parallel to the first contact element.

3. The electrical mount according to claim 2, wherein the first contact element comprises a spring member.

4. The electrical mount according to claim 3, wherein said spring member is a leaf, arch-shaped, dome-shaped, coiled spring or other spring-like shape.

5. The electrical mount according to claim 2, wherein the second contact element is a fin integral to said main body, extending transversely from the main axis of the main body.

6. The electrical mount according to claim 5, wherein the second contact element is adapted to retain the electrical mount in the opening of the second panel.

7. The electrical mount according to claim 2, further comprising: a fastener to fasten the second contact element to the inside surface of the second panel.

8. The electrical mount according to claim 7, wherein said fastener couples with the front end of said main body of the electrical mount by screw thread or rachet and paw engagement.

9. The electrical mount according to claim 7, further comprising: an insulator cap to insulate a user from physically contacting said fastener.

10. The electrical mount according to claim 9, wherein the insulator cap is provided with a gasket seal or O-ring for splash proof or waterproof installation.

11. The electrical mount according to claim 9, wherein the insulator cap is integrally formed with a light reflector.

12. The electrical mount according to claim 11, wherein the light reflector is in any form, shape, size or material.

13. The electrical mount according to claim 11, wherein the light reflector is sealed with a transparent cover for splash proof usage.

14. The electrical mount according to claim 1, wherein said electrical receptacle is a threaded standard light socket, a bayonet connector, a pin-type connector, a quick coupling light fixture connector, or a customised socket.

15. An adapter for the electrical mount according to claim 14 to convert the receptacle of said electrical mount to cigarette lighter socket female or USB female receptacles.

16. A conductive panel assembly comprising:
  a first panel and a second panel, said two panels spaced apart and arranged in a face-to-face relation, where each of said panels has a respective inside surface, said inside surfaces are arranged in the face-to-face relation, each of said inside surfaces has a respective electrical conductive layer, and
  an electrical mount comprising:
    a main body, wherein a backend of said main body is disposed in the space between the two panels and a front end of said main body extends out on an exposed surface of the second panel from an opening in said second panel;
    an electrical receptacle disposed in the front end of the main body for receiving an electrical/electronic element; and
    two contact elements supported by said main body for power lead-in to the electrical/electronic element when received by said electrical receptacle, wherein said two contact elements define two substantially planar but spaced apart contact planes,
  wherein an AC or DC power supply, connectable to said electrical conductive layers of said inside surfaces, delivers electric power to the electrical/electronic element when received by said electrical receptacle.

17. The conductive panel assembly according to claim 16, wherein said panels comprise transparent glass, plastic, wood or any non-conductive materials.

18. The conductive panel assembly according to claim 16, wherein at least one of said electrical conductive layers is transparent, the conductive layer comprising transparent conductive oxide (TCO) coating such as indium tin oxide (ITO).

19. The conductive panel assembly according to claim 16, wherein at least one of said electrical conductive layers is conductive strip, tape, ink or glue.

20. The conductive panel assembly according to claim 16, wherein sections of said panel assembly that make contact with said electrical mount is additionally coated with transparent conductive coating of higher conductivity.

* * * * *